(12) United States Patent
Takagi et al.

(10) Patent No.: US 7,284,180 B2
(45) Date of Patent: *Oct. 16, 2007

(54) DATA RECORDING METHOD, RECORDING MEDIUM AND REPRODUCTION APPARATUS

(75) Inventors: Yuji Takagi, Osaka (JP); Makoto Usui, Osaka (JP); Hiroyuki Yabuno, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/379,314

(22) Filed: Apr. 19, 2006

(65) Prior Publication Data

US 2006/0206782 A1 Sep. 14, 2006

Related U.S. Application Data

(63) Continuation of application No. 11/366,140, filed on Mar. 2, 2006, which is a continuation of application No. 10/484,016, filed on Aug. 9, 2004, now Pat. No. 7,111,222.

(51) Int. Cl.
H03M 13/00 (2006.01)
(52) U.S. Cl. .................................... 714/755
(58) Field of Classification Search ................ 714/751, 714/752, 755
See application file for complete search history.

(56) References Cited

U.S. PATENT DOCUMENTS

| 4,653,051 A | 3/1987 | Sugimura et al. ........... 714/755 |
| 4,742,517 A | 5/1988 | Takagi et al. ............... 714/702 |
| 5,696,774 A | 12/1997 | Inoue et al. ................ 714/755 |
| 6,076,184 A | 6/2000 | Nagai et al. ................ 714/769 |
| 6,112,324 A | 8/2000 | Howe et al. ................ 714/763 |
| 6,338,155 B1 | 1/2002 | Noda ......................... 714/763 |

FOREIGN PATENT DOCUMENTS

| JP | 2000-040307 | 2/2000 |
| JP | 2000-209104 | 7/2000 |

OTHER PUBLICATIONS

Yi et al.; "Interleaving and Decoding Scheme for a Product Code for a Mobile Data Communication"; IEEE Transactions on Communications, vol. 45, No. 2, Feb. 1997, pp. 144-147.

Yamamoto et al.; "Error Modeling and Performance Analysis of Error-Correcting Codes for the Digital Video Recording System"; SPIE, vol. 3864, pp. 339-341, Jul. 1999.

Primary Examiner—Shelly A Chase
(74) Attorney, Agent, or Firm—Renner, Otto, Boisselle & Sklar, LLP

(57) ABSTRACT

A recording medium for storing a data stream is comprised of first error correcting codes obtained by encoding first information, and second error correcting codes obtained by encoding second information, and synchronization signals. The first error correcting codes have a first correction capability. The second error correcting codes have a second correction capability higher than the first correction capability. In the data stream, the second error correcting codes and the synchronization signals alternatively interleave the first error correcting codes. The first and second error correcting codes are encoded using Reed-Solomon codes.

3 Claims, 10 Drawing Sheets

DATA RECORDING METHOD, RECORDING MEDIUM AND REPRODUCTION APPARATUS

This application is a continuation of U.S. patent application Ser. No. 11/366,140, filed on Mar. 2, 2006, which is a continuation of U.S. patent application Ser. No. 10/484,016, filed on Aug. 9, 2004 now U.S. Pat No. 7,111,222, and similarly claims priority to International Application No. PCT/JP02/07232, filed Jul. 16, 2002 and Japanese Application JP 2001-220510 filed on Jul. 19, 2001, which are hereby incorporated by reference in their entirety.

TECHNICAL FIELD

The present invention relates to: a data recording method used when data, such as AV data and computer data, is recorded onto a recording medium, such as a DVD; the recording medium storing the data; and an apparatus for reproducing the data from the recording medium.

BACKGROUND ART

Conventionally, an error correcting code, such as a Reed-Solomon code, has been used to correct errors on a recording medium, such as a DVD, caused by defects of the medium, or dust or scratches attached on the disk surface.

Recently, in the field of digital video recording, research has been developed toward the next-generation DVDs having higher density and greater capacity than conventional DVDs. In such research, as the density of a recording medium is increased, there is a demand for a reduction in the influence of burst errors due to dust or scratches.

To meet such a demand, a recording method has been proposed in, for example, Kouhei Yamamoto et al., "Error Modeling and Performance Analysis of Error-Correcting Codes for the Digital Video Recording System (Part of the Joint International Symposium on Optical Memory and Optical Data Storage 1999 • Koloa, Hi. • July 1999 SPIE Vol. 3864, pp. 339-341)". In this method, two error correcting codes are interleaved so as to improve a capability of correcting burst errors.

Another data recording method, in which two or more error correcting codes are interleaved, is disclosed in detail in Japanese Laid-Open Publication No. 2000-40307.

FIG. 9 is a schematic diagram showing a conventional construction of error correcting codes in Yamamoto et al.

As shown in FIG. 9, user data of about 64 Kbytes is divided into 304 columns of 216 bytes each, which are referred to as an information portion. A parity of 32 bytes is added to each information portion to form a first error correcting code 901. The first error correcting code 901 is encoded using Reed-Solomon codes over the finite field GF (256). A component symbol is a minimum element constituting a code and has a length of 1 byte.

The correction capability of the first error correcting code 901 is evaluated as follows.

Generally, $$d \geq 2 \times t + 1$$

is established where d represents the minimum distance between each code and t represents the possible number of corrections.

Each first error correcting code 901 contains a 32-byte parity. The minimum distance between two first error correcting codes is 33. Therefore, according to the above-described relationship, the first error correcting code 901 has correction capability of correcting any up to 16 (byte) errors in the code length of 248 (bytes).

In the correction process, when an error position is known, information on the known error position can be used to perform erasure correction. Erasure correction is a method in which when a certain code is subjected to a correction operation and an erroneous component symbol (the minimum unit of a code) is known in advance, the component symbol is assumed to be erased and the erased component symbol is calculated from the remaining component symbols. When error positions are known, the erasure correction can enhance the correction capability by a factor of up to 2.

This can be explained by the following relationship:

$$d \geq 2 \times t + e + 1,$$

where d represents the minimum distance between each code and t represent the number of corrections, and e represents the number of erasure corrections.

In the case of the first error correcting code 901 where the minimum distance d=33, if all corrections are performed by erasure correction (i.e., t=0), up to 32 (bytes) component symbols can be corrected (e=32).

As shown in FIG. 9, control data of 720 bytes is divided into 24 columns of 30 bytes each, which are referred to as an information portion. A parity of 32 bytes is added to each information portion to form a second error correcting code 902. The second error correcting code 902 is encoded using Reed-Solomon codes over the finite field GF (256). A component symbol is a minimum element constituting a code and has a length of 1 byte. Note that the 720-byte control data contains address information and the like used when the user data is eventually recorded onto an optical disk.

Each second error correcting code 902 also contains a 32-byte parity. The minimum distance between two second error correcting codes 902 is 33 as in the first error correcting code 901. Therefore, the second error correcting code 902 has correction capability of correcting any up to 16 (byte) errors in the code length of 62 (bytes). The number of corrections of the second error correcting code 902 is the same as that of the first error correcting code 901 (16 (bytes)). However, since the second error correcting code 902 has a shorter code length than that of the first error correcting code 901, the correction capability of the second error correcting code 902 is higher than that of the first error correcting code 901.

In this manner, the first error correcting codes 901 and the second error correcting codes 902 are constructed and are then interleaved along with a synchronization signal 903 to generate data streams which are in turn recorded onto a recording medium.

FIG. 10 shows a structure of a data stream in which the conventional first error correcting codes 901 and second error correcting codes 902 shown in FIG. 9 are interleaved along with a synchronization signal under a predetermined interleaving rule.

In FIG. 10, 901a to 901h indicate first error correcting codes, 902a to 902f indicate second error correcting codes, and 903a and 903b are synchronization signals. Component symbols constituting the codes and the synchronization signals are recorded so that they are arranged in a matrix of 312 columns×248 rows and interleaved in the row direction. Each code is encoded in the column direction (vertical direction) and is to be recorded in a row direction (horizontal direction), thereby providing the construction which is robust to burst errors. In the conventional example, a synchronization signal of 1 byte is added per 155 bytes (=38+1+38+1+38+1+38 bytes). The 156 bytes constitute one frame. The data stream has a so-called frame structure. The synchronization signal is used to synchronize data within a frame on a byte-by-byte basis and specify the position of a frame in the entire data stream (data block). The synchronization signal is also used to pull in synchronization at the start of reproduction or perform resynchronization when a bit slip or the like occurs. To this end, the synchronization signal has a pattern, which cannot be generated by demodulation performed when a data stream is finally recorded onto an optical disk, and a predetermined pattern signal comprising a frame number and the like. The reproduction apparatus determines whether or not a pattern reproduced by the reproduction apparatus is identical to a corresponding predetermined pattern which should have been recorded, thereby causing the synchronization signal to function.

As is seen from the data construction of FIG. 10, 38 byte component symbols in each first error correcting code is interposed between a 1 byte synchronization signal and a 1 byte component symbol in a second error correcting code or between 1 byte component symbols in two second error correcting codes. The ratio of the number of columns having a synchronization signal to the number of columns having component symbols of a second error correcting code is 1:3. It is possible to generate erasure flags indicating error position information for erasure correction, depending on whether or not an error is detected in a synchronization signal or component symbols in a second error correcting code, based on the result of synchronization detection of a synchronization signal or the result of error correction using a second error correcting code having correction capability higher than that of the first error correcting codes.

For example, it is assumed that when a second error correcting code is subjected to error correction, an error is detected in component symbols of two consecutive second error correcting codes 902*e* and 902*f* (902*e-x* and 902*f-x* in FIG. 10) and error correction is actually performed. In this case, a possibility that an error occurs in 38 byte component symbols in the first error correcting code 901*g* interposed between component symbols of the second error correcting codes 902*e-x* and 902*f-x* is considered to be high (i.e., a burst error is assumed to occur). In this case, an erasure flag 905*c* is generated for the component symbol in the first error correcting code 901*g*.

Similarly, for example, for 38 byte component symbols in the first error correcting code 901*a* interposed between the synchronization signal 903*a* and component symbols in the second error correcting code 902*a*, and 38 byte component symbols in the first error correcting code 901*d* interposed between component symbols in the second error correcting code 902*a* and the synchronization signal 903*b*, an error is detected in the result of error correction of the second error correcting code or the result of synchronization detection of whether or not a synchronization signal is detected, and using the result, erasure flags are generated for component symbols in the first error correcting codes 901*a* and 901*d*. In FIG. 10, an erasure flag 905*a* is generated as a result of detection of errors in 903*a-x* and 902*a-x* and an erasure flag 905*b* is generated as a result of detection of errors in 902*a-x* and 903*b-x*.

As described above, erasure flags can be used to perform erasure correction, thereby making it possible to improve correction capability (the number of corrections) by a factor of up to 2. Therefore, an excellent resistance to burst errors due to scratches or dust can be obtained.

In the above-described conventional example, the result of error correction of the second error correcting codes or the result of detection of a synchronization signal is used to generate a corresponding erasure flag.

The error detection using a second error correcting code is different from the error detection using the synchronization signal in terms of capability of detecting errors due to the difference between detection methods. The error detection using a synchronization signal has detection capability much higher than the error detection using a second error correcting code.

In the conventional example, the second error correcting code has correction capability higher than that of the first error correcting code, though the correction capability is as low as 16 (bytes) in 62 (bytes). Therefore, when 17 or more (byte) errors occur in 62 (bytes), it is not possible to correct the errors. In this case, it is not possible to use an erasure flag to specify an error position.

The error detection using a synchronization signal can be performed simply by comparing a reproduced synchronization signal with the synchronization signal before reproduction on a bit-by-bit basis. Even when 17 or more (byte) (e.g., 62 byte) errors occur in a synchronization signal, all of the errors can be detected.

Therefore, in the conventional example, the same first error correcting codes have different reliabilities of error correction depending on the position of the first error correcting code in the data stream. i.e., how the first error correcting code is interleaved with a second error correcting code(s) and/or a synchronization signal(s). Specifically, a first error correcting code interposed between component symbols in two second error correcting codes having lower detection capability is less reliable than another first error correcting code interposed between a synchronization signal and a second error correcting code, due to the error detection capability.

When higher and lower reliabilities coexist, the reliability of the entirety is constrained by the lowest reliability. In the conventional example, it is very likely that an error state, such as incapability of data reproduction, occurs in a first error correcting code interposed between component symbols in two second error correcting codes having lower reliability and low error detection capability.

The present invention is provided to solve the above-described problems. The object of the present invention is to provide a data recording method, a recording medium and a reproduction apparatus whose overall correction capability is improved by removing the difference in error detection reliability depending on the position of the first error correcting code in the data stream, i.e., how first error correcting codes are interleaved with second error correcting codes and synchronization signals, and by which highly reliable reproduction can be performed.

DISCLOSURE OF THE INVENTION

The present invention provides a data recording method, comprising the steps of encoding user data into first error correcting codes having a first correction capability, encoding control information into second error correcting codes having a second correction capability higher than the first correction capability, generating a date stream containing the first error correcting code, the second error correcting code, and synchronization signals, in which the second error correcting codes and the synchronization signals alternatively interleave the first error correcting codes; and recording the data stream. Thereby, the above-described object can be achieved.

The present invention also provides a recording medium storing a data stream containing first error correcting codes obtained by encoding user data, second error correcting codes obtained by encoding control information, and synchronization signals, in which the first error correcting codes have a first correction capability, the second error correcting codes have a second correction capability higher than the first correction capability, and in the data stream, the second error correcting codes and the synchronization signals alternatively interleave the first error correcting codes. Thereby, the above-described object can be achieved.

The present invention also provides a reproduction apparatus for reproducing the data stream recorded on the recording medium, the apparatus comprising a reproduction section for generating binary data from the data stream, a demodulation section for demodulating the binary data into the first error correcting codes and the second error correcting codes, wherein the demodulation section comprises a synchronization signal detecting section for generating a result of detection of the synchronization signal, and an error correcting section for detecting an error in the first error correcting codes and the second error correcting codes output from the demodulation section, and correcting the error, in which wherein the error correcting section comprises an erasure flag generating section to the first error correcting code for generating an erasure flag for erasure correction based on a result of error correction of the second error correcting code or a result of detection of the synchronization signal, and an erasure correcting section for using the erasure flag to perform erasure correction. Thereby, the above-described object can be achieved.

In one embodiment of this invention, when the synchronization signal detecting section detects the synchronization signal at a time different from a predicted time, the erasure flag generating section places an erasure flag in a component symbol of the first error correcting code upstream in the data stream from the synchronization signal.

In one embodiment of this invention, when the synchronization signal detecting section detects the synchronization signal at a time different from a predicted time, and an error is detected in a component symbol of the second error correcting code upstream in the data stream from and closest to the synchronization signal, the erasure flag generating section places an erasure flag in a component symbol of the first error correcting code upstream in the data stream from the synchronization signal.

In one embodiment of this invention, when the synchronization signal detecting section detects the synchronization signal at a time different from a predicted time, and an error is not detected in a component symbol of the second error correcting code upstream in the data stream from and closest to the synchronization signal, the erasure flag generating section places an erasure flag in a component symbol of the first error correcting code between the second error correcting code and the synchronization signal.

In one embodiment of this invention, the synchronization signal detecting section counts the number of clocks and reproduced bits from the time of detecting the synchronization signal and, based on the counting result, predicts a time of detection of the next synchronization signal.

The present invention also provides an error correcting circuit for use in the reproduction apparatus, comprising an erasure flag generating section to the first error correcting code for generating an erasure flag for erasure correction based on a result of error correction of the second error correcting code or a result of detection of the synchronization signal, and an erasure correcting section for using the erasure flag to perform erasure correction. Thereby, the above-described object can be achieved.

In one embodiment of the present invention, when the synchronization signal detecting section detects the synchronization signal at a time different from a predicted time, the erasure flag generating section places an erasure flag in a component symbol of the first error correcting code upstream in the data stream from the synchronization signal.

In one embodiment of the present invention, when the synchronization signal detecting section detects the synchronization signal at a time different from a predicted time, and an error is detected in a component symbol of the second error correcting code upstream in the data stream from and closest to the synchronization signal, the erasure flag generating section places an erasure flag in a component symbol of the first error correcting code upstream in the data stream from the synchronization signal.

In one embodiment of the present invention, when the synchronization signal detecting section detects the synchronization signal at a time different from a predicted time, and an error is not detected in a component symbol of the second error correcting code upstream in the data stream from and closest to the synchronization signal, the erasure flag generating section places an erasure flag in a component symbol of the first error correcting code between the second error correcting code and the synchronization signal.

In one embodiment of the present invention, the synchronization signal detecting section counts the number of clocks and reproduced bits from the time of detecting the synchronization signal and, based on the counting result, predicts a time of detection of the next synchronization signal.

BRIEF DESCRIPTION OP THE DRAWINGS

BEST MODE FOR CARRYING OUT THE INVENTION

Hereinafter, the present invention will be described by way of illustrative examples with reference to the accompanying drawings.

Figure 1:
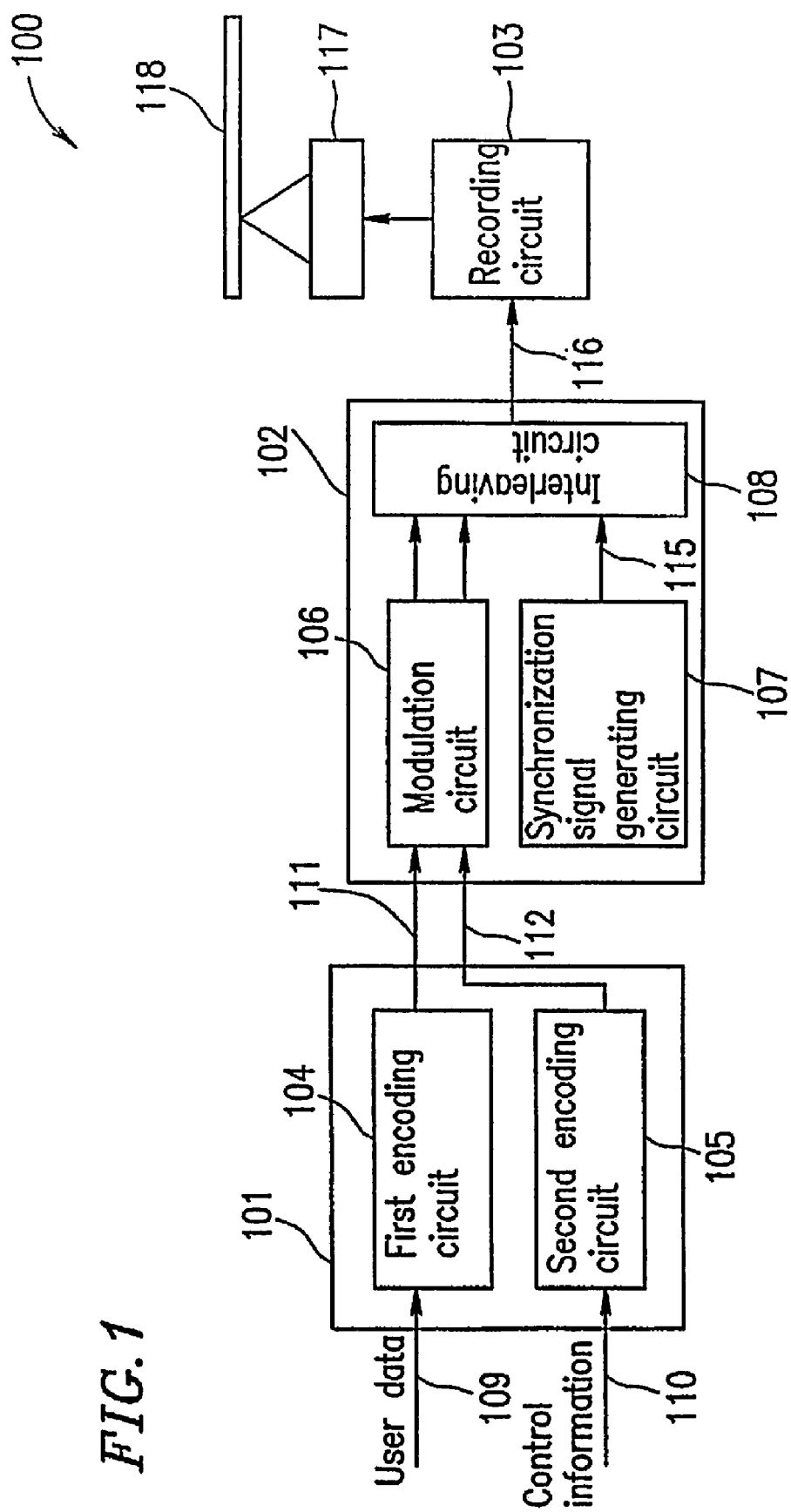
FIG. 1 is a schematic diagram showing a structure of a recording apparatus for recording data into a recording medium according to the present invention.

FIG. 1 is a schematic diagram showing a structure of a recording apparatus 100 for recording data onto a recording medium. Examples of the recording medium include, but are not limited to, optical disks, magnetic disks, and magneto-optic disks. The present invention can be applied to any recording medium. An optical disk is employed in the following examples.

The recording apparatus 100 comprises an encoder 101, a modulator 102, and a recording circuit 103. The encoder 101 may comprise a first encoding circuit 104 and a second encoding circuit 105. The modulator 102 comprises a modulating circuit 106, a synchronization signal generating circuit 107, and an interleaving circuit 108.

User data 109 is input to the first encoding circuit 104. Control information 110 is input to the second encoding circuit 105. The user data 109 is binary bit data. Examples of the user data 109 include AV data, text data, and application program data. The control information 110 is information used for control of the user data 109. Examples of the control information 110 include address information, and copyright management information (copy permission information, encryption key information, etc.).

The first encoding circuit 104 generates first error correcting codes 111 from the user data 109, and sends them to the modulating circuit 106 of the modulator 102. Similarly, the second encoding circuit 105 generates second error correcting codes 112 from the control information 110, and sends them to the modulating circuit 106 of the modulator 102. It is here assumed that the first error correcting code 111 has a first correction capability and the second error correcting code 105 has a second correction capability higher than the first correction capability. The modulating circuit 106 optionally modulates the first error correcting code 111 and the second error correcting code 112, and sends the resultant codes to the interleaving circuit 108. The synchronization signal generating circuit 107 generates a synchronization signal 115 for correcting bit slips or the like, and sends the synchronization signal 115 to the interleaving circuit 108. The interleaving circuit 108 generates a data stream 116 containing the first error correcting codes 111, the second error correcting codes 112 and the synchronization signals 115, in which the first error correcting codes 111 are interleaved alternately with the second error correcting codes 112 and the synchronization signals 115, and sends the data stream 116 to the recording circuit 103. The recording circuit 103 receives the data stream 116 from the interleaving circuit 108 and records it onto an optical disk 118 using an optical head 117.

As described, the recording apparatus 100 of the present invention generates a data stream 116 containing the first error correcting codes 111, the second error correcting codes 112 and the synchronization signals 115, in which the first error correcting codes 111 are interleaved alternately with the second error correcting codes 112 and the synchronization signals 115, and records the data stream 116 onto the optical disk 118.

Next, a data structure along the course of the recording of the user data 109 and the control information 110 produced by the recording apparatus 100 of the present invention onto the optical disk 108 will be described with reference to FIGS. 2 to 4.

Figure 2:
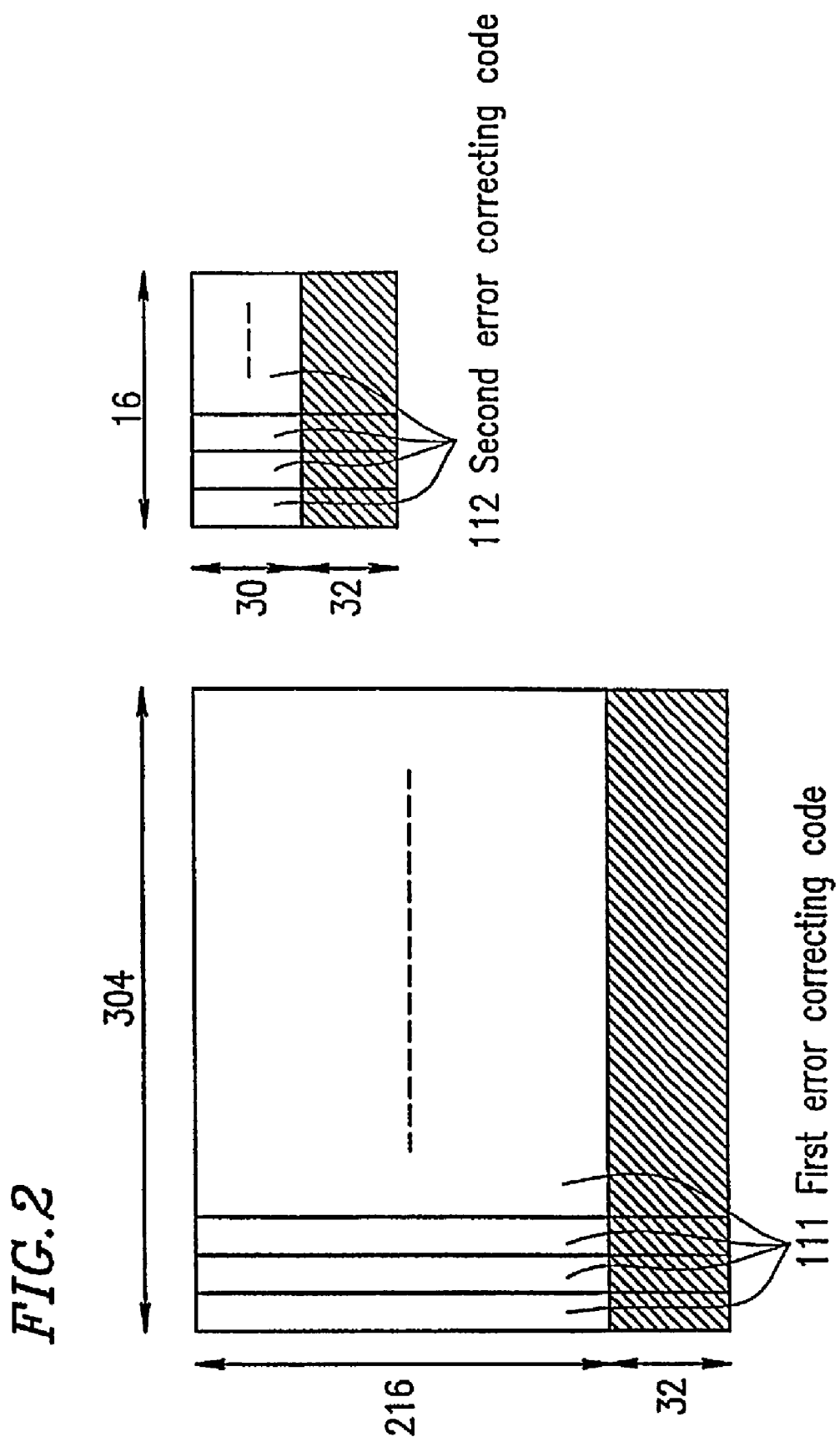
FIG. 2 is a schematic diagram showing first error correcting codes and second error correcting codes before being interleaved using a method according to the present invention.

FIG. 2 is a schematic diagram showing the first error correcting codes 111 and the second error correcting codes 112 before being interleaved.

User data of about 64 Kbytes is divided into 304 columns of 216 bytes each, which are referred to as an information portion. A parity of 32 bytes is added to each information portion to form a first error correcting code 111. The first error correcting code 111 is encoded using Reed-Solomon codes over the finite field GF (256). A component symbol is a minimum element constituting a code and has a length of 1 byte. The encoding direction of the first error correcting code 111 is a column direction (vertical direction).

The correction capability of the first error correcting code 111 is evaluated as follows.

Generally, $$d \geq 2 \times t + 1$$

is established where d represents the minimum distance between each code and t represents the possible number of corrections.

Each first error correcting code 111 contains a 32-byte parity. The minimum distance between two first error correcting codes is 33. Therefore, according to the above-described relationship, the first error correcting code 111 has correction capability of correcting any up to 16 (byte) errors in the code length of 248 (bytes).

In the correction process, when an error position is known, information on the known error position can be used to perform erasure correction. Erasure correction is a method in which when a certain code is subjected to a correction operation and an erroneous component symbol (the minimum unit of a code) is known in advance, the component symbol is assumed to be erased and the erased component symbol is calculated from the remaining component symbols. When error positions are known, the erasure correction can enhance the correction capability by a factor of up to 2.

This can be explained by the following relationship:

$$d \geq 2 \times t + e + 1,$$

where d represents the minimum distance between each code and t represent the number of corrections, and e represents the number of erasure corrections.

In the case of the first error correcting code 111 where the minimum distance d=33, if all corrections are performed by erasure correction (i.e., t=0), up to 32 (bytes) component symbols can be corrected (e=32).

As shown in FIG. 2, control data of 480 bytes is divided into 16 columns of 30 bytes each, which are referred to as an information portion. A parity of 32 bytes is added to each information portion to form a second error correcting code 112. The second error correcting code 112 is encoded using Reed-Solomon codes over the finite field GF (256). A component symbol is a minimum element constituting a code and has a length of 1 byte. Note that the 480-byte control data contains address information and the like used when the user data is eventually recorded onto an optical disk.

Each second error correcting code 112 also contains a 32-byte parity. The minimum distance between two second error correcting codes 112 is 33 as in the first error correcting code 111. Therefore, the second error correcting code 112 has correction capability of correcting any up to 16 (byte) errors in the code length of 62 (bytes). The number of corrections of the second error correcting code 112 is the same as that of the first error correcting code 111 (16 (bytes)). However, since the second error correcting code 112 has a shorter code length than that of the first error correcting code 111, the correction capability of the second error correcting code 112 is higher than that of the first error correcting code 111.

In this manner, the first error correcting codes 111 and the second error correcting codes 112 are constructed. In the present invention, the recording apparatus 100 alternately interleaves the first error correcting codes 111 with the second error correcting codes 112 and the synchronization signal 115 to generate the data stream 116 which is in turn recorded onto the optical disk 118.

Figure 3:
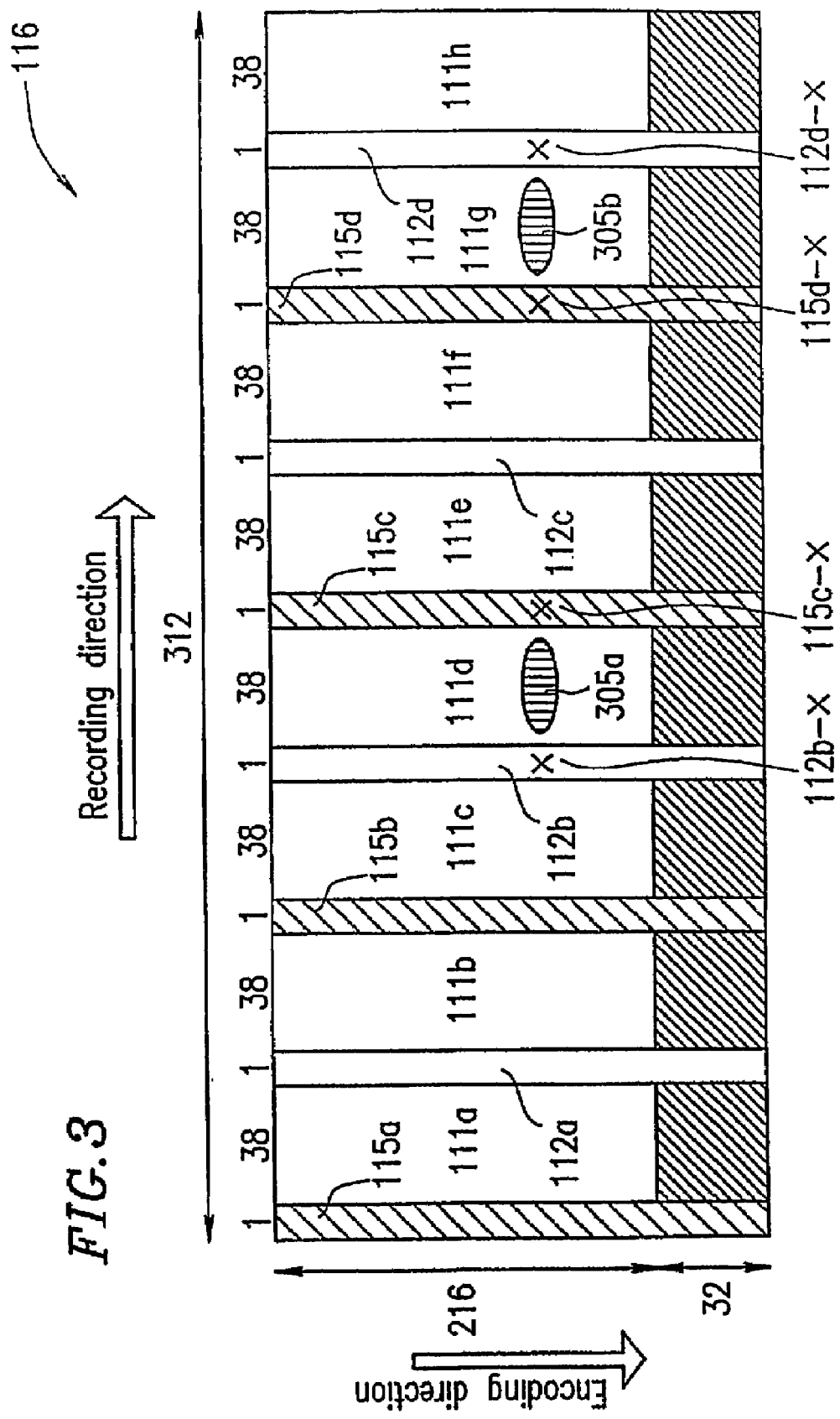
FIG. 3 is a diagram showing a data structure of a data stream in which first error correcting codes and second error correcting codes shown in FIG. 2 are interleaved with synchronization signals in accordance with a predetermined interleaving rule.

FIG. 3 shows a structure of the interleaved data stream 116.

In FIG. 3, 111a to 111h indicate first error correcting codes, 112a to 112d indicate second error correcting codes, and 115a to 115d indicate synchronization signals. Component symbols constituting the codes and the synchronization signals are recorded so that they are arranged in a matrix of 312 columns×248 rows and interleaved in the row direction. Each code is encoded in the column direction (vertical direction) and is to be recorded in the row direction (horizontal direction), thereby providing the construction which is robust to burst errors. In this example, a synchronization signal of 1 byte is added per 77 bytes (=38+1+38 bytes). The 78 bytes constitute one frame. The data stream has a so-called frame structure. The synchronization signal is used to synchronize data within a frame on a byte-by-byte basis and specify the position of a frame in the entire data stream (data block). The synchronization signal is also used to pull in synchronization at the start of reproduction or perform resynchronization when a bit slip or the like occurs. To this end, the synchronization signal has a pattern, which cannot be generated by demodulation performed when a data stream is finally recorded onto an optical disk, and a predetermined pattern signal comprising a frame number and the like. The reproduction apparatus determines whether or not a pattern reproduced by the reproduction apparatus is identical to a corresponding predetermined pattern which should have been recorded, thereby causing the synchronization signal to function. Note that although the length of the synchronization signal is one byte in this example, the length of the synchronization signal is not necessarily limited to one byte but can be any value depending on the modulation method or the like.

As is seen from the data construction of FIG. 3, 38 byte component symbols in each first error correcting code is always interposed between a 1 byte synchronization signal and a 1 byte component symbol in a second error correcting code. The ratio of the number of columns having a synchronization signal to the number of columns having component symbols of a second error correcting code is 1:1. It is possible to generate erasure flags indicating error position information for erasure correction, depending on whether or not an error is detected in a synchronization signal or component symbols in a second error correcting code, based on the result of synchronization detection of a synchronization signal or the result of error correction using a second error correcting code having correction capability higher than that of the first error correcting codes.

For example, it is assumed that 115d-x, which is an element of the synchronization signal 115d, is not detected and an error is detected in a component symbol 112d-x in the second error correcting code 112d in error correction of the second error correcting code 112d. In this case, a possibility that an error occurs in 38 byte component symbols in the first error correcting code 111g interposed between 115d-x and 112d-x is considered to be high (i.e., a burst error is assumed to occur). In this case, an erasure flag 305b is generated for the component symbol in the first error correcting code 111g.

Similarly, for example, it is assumed that an error is detected in a component symbol 112b-x in the second error correcting code 112b in error correction of the second error correcting code 112b, and 115c-x, which is an element of the synchronization signal 115c, in not detected. In this case, a possibility that an error occurs in 38 byte component symbols in the first error correcting code 111d interposed between 112b-x and 115c-x is considered to be high (i.e., a burst error is assumed to occur). In this case, an erasure flag 305a is generated for the component symbol in the first error correcting code 111d.

As described above, in the present invention, in a data stream, a first error correcting code is always interposed between a 1 byte synchronization signal and a 1 byte component symbol in a second error correcting code. Therefore, all first error correcting codes can be subjected to equal error detection. Therefore, the present invention can circumvent the above-described conventional problem in which the accuracy of error detection varies depending on the position of the first error correcting code in a data stream, i.e., how the first error correcting code is Interleaved with the second error correcting code and the synchronization signal in the data stream and as a result the overall reliability of the data stream fluctuates.

An described above, erasure flags can be used to perform erasure correction, thereby making it possible to improve correction capability (the number of corrections) by a factor of up to 2. Therefore, an excellent resistance to burst errors due to scratches or dust on the recording medium surface can be obtained.

When an erasure flag is generated from a synchronization signal, a resynchronization function when a bit slip occurs (an inherent function of the synchronization signal) can be used to generate an erasure flag with higher accuracy. For example, in reproduction, when a synchronization signal is detected, however the synchronization signal is reproduced at a position shifted by several clocks from the normal position, erasure flags are added to only component symbols in a first error correcting code recorded upstream along the data stream from the synchronization signal, rather than resynchronization. This is because data upstream along the data stream from a reproduced synchronization signal is likely to be erroneous due to loss of synchronization, and data downstream from the synchronization signal is likely not to be erroneous.

The term "add an erasure flag" or "generate an erasure flag" refers to attach a mark, which indicates that a component symbol may be erased (i.e., an error may occur in the component symbol), to the component symbol. Addition of an erasure flag is performed as follows, for example. A bit map of 248×304 bits is prepared where one bit is assigned to each symbol of all of the first error correcting codes in a data block (including 248×304 component symbols). The addition of an erasure flag is represented by causing a corresponding bit to be 1. When no erasure flag is added, a corresponding bit is caused to be 0.

The synchronization signal is herein 1 byte in length, but the length may vary depending on the modulation format or the like.

The first error correcting code and the second error correcting code may each contain any number of component symbols.

The error detection using a synchronization signal has an error detection capability higher than the error detection in which whether or not an error occurs in each byte is determined. A synchronization signal having high detection capability is placed adjacent either before or after each of all of the first error correcting codes having a unit length of 38 bytes. Therefore, a highly reliable data recording method can be achieved.

As described above, in the data recording method of the present invention, the recording apparatus generates a data stream containing first error correcting codes, second error correcting codes and synchronization signals in which the second error correcting codes and the synchronization signals alternately interleave the first error correcting codes, and the data stream is recorded onto a recording medium. Thus, equal error detection can be applied to all of the first error correcting codes. Therefore, the accuracy of error detection does not vary depending on the position of the first error correcting code in the data stream interleaved with the second error correcting code and the synchronization signals, so that the first error correcting codes can have high reliability throughout the data stream.

Figure 4:
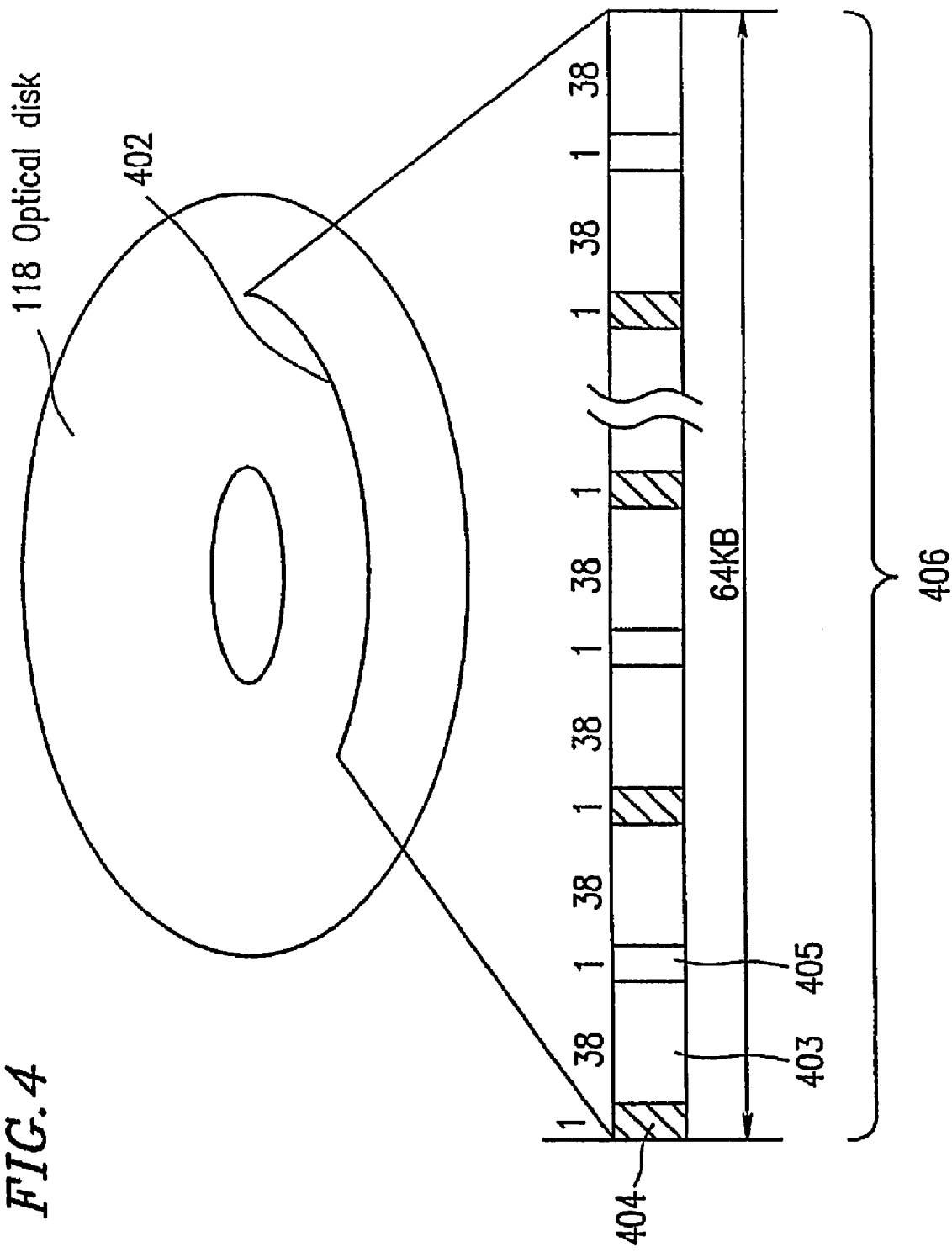
FIG. 4 is a diagram showing a structure of data recorded in a spiral or concentric track of an optical disk according to the present invention.

FIG. 4 shows data 406 recorded in a spiral or concentric track 402 on the optical disk 118 the data 406 contains a portion 403 of the first error correcting code, a portion 405 of the second error correcting code, and a portion 404 of the synchronization signal. The data 406 is obtained by dividing the data stream 116 (FIG. 3) into 248 rows along the row direction (horizontal direction) and contiguously linking the rows. This manner will be described below with reference to FIG. 5.

Figure 5:
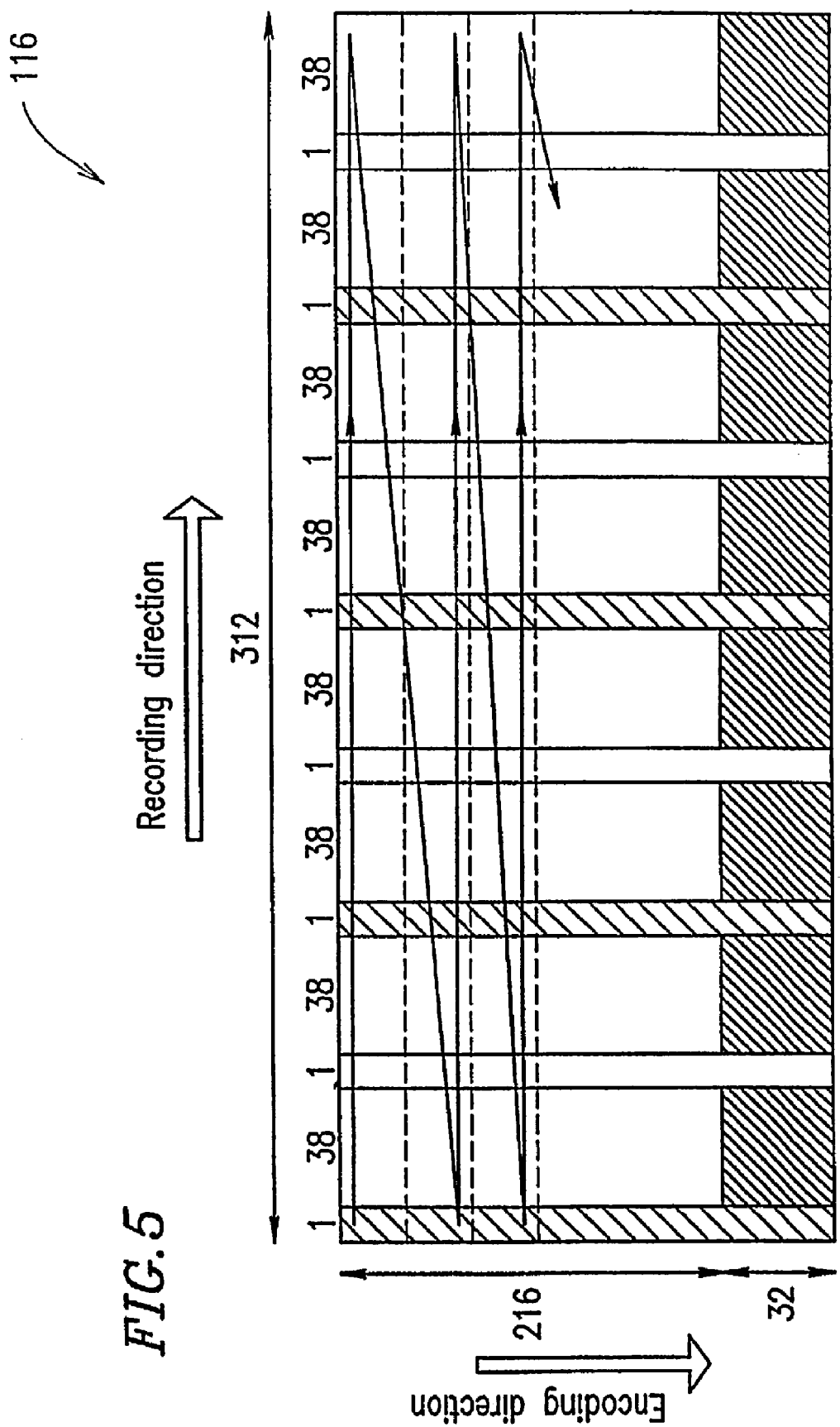
FIG. 5 is a diagram showing a recording order of a data stream according to the present invention.

FIG. 5 is a diagram showing the recording order of the data stream 116. The data stream 116 divided into 248 rows along the row direction, are recorded onto the optical disk 118 in the order indicated by arrows shown in FIG. 5. Note that the recording order of the divided data stream 116 is not limited to the manner shown in FIG. 5, but the divided data stream 116 may be recorded onto the optical disk 118 in any order.

The recording of the optical disk 118 is actually performed with convex and concave pits, variable-density dots of a phase change material, or the like. In recording, typically, coded data is subjected to digital modulation using modulation codes, such as 8/16 modulation or RLL (1,7) codes, before being recorded into a disk track. Note that in FIG. 4, the description of the modulation using modulation codes is omitted for the sake of simplicity, and the coded data is recorded as it is.

On the optical disk 118, the data 406 is recorded in the order of a portion 404 of the synchronization signal (1 byte), a portion 403 of the first error correcting code (38 bytes), a portion 405 of the second error correcting code (1 byte), a portion 403 of the first error correcting is code (1 byte), . . . , and so on. In other words, the portions 405 of the second error correcting codes and the portions 404 of the synchronization signals alternatively interleave the portions 403 of the first error correcting codes.

Thus, in the case of the optical disk of the present invention, data is constructed so that the component symbols of the second error correcting codes and the synchronization signals alternately interleave the component symbols of the first error correcting codes, and the data is recorded onto the optical disk. For this reason, when such an optical disk is reproduced, equal error detection can be applied to all component symbols of the first error correcting codes. Therefore, the accuracy of error detection does not vary depending on the position of the first error correcting code in the data stream interleaved with the second error correcting code and the synchronization signals, so that the first error correcting codes can have high reliability throughout the data stream.

Note that the optical disk of the present invention is not limited to an optical disk recorded using the method of the present invention (i.e., the method using the recording apparatus 100 shown in FIG. 1), but may be disks recorded by any method as long as data recorded in the optical disk has the above-described data structure.

Figure 6:
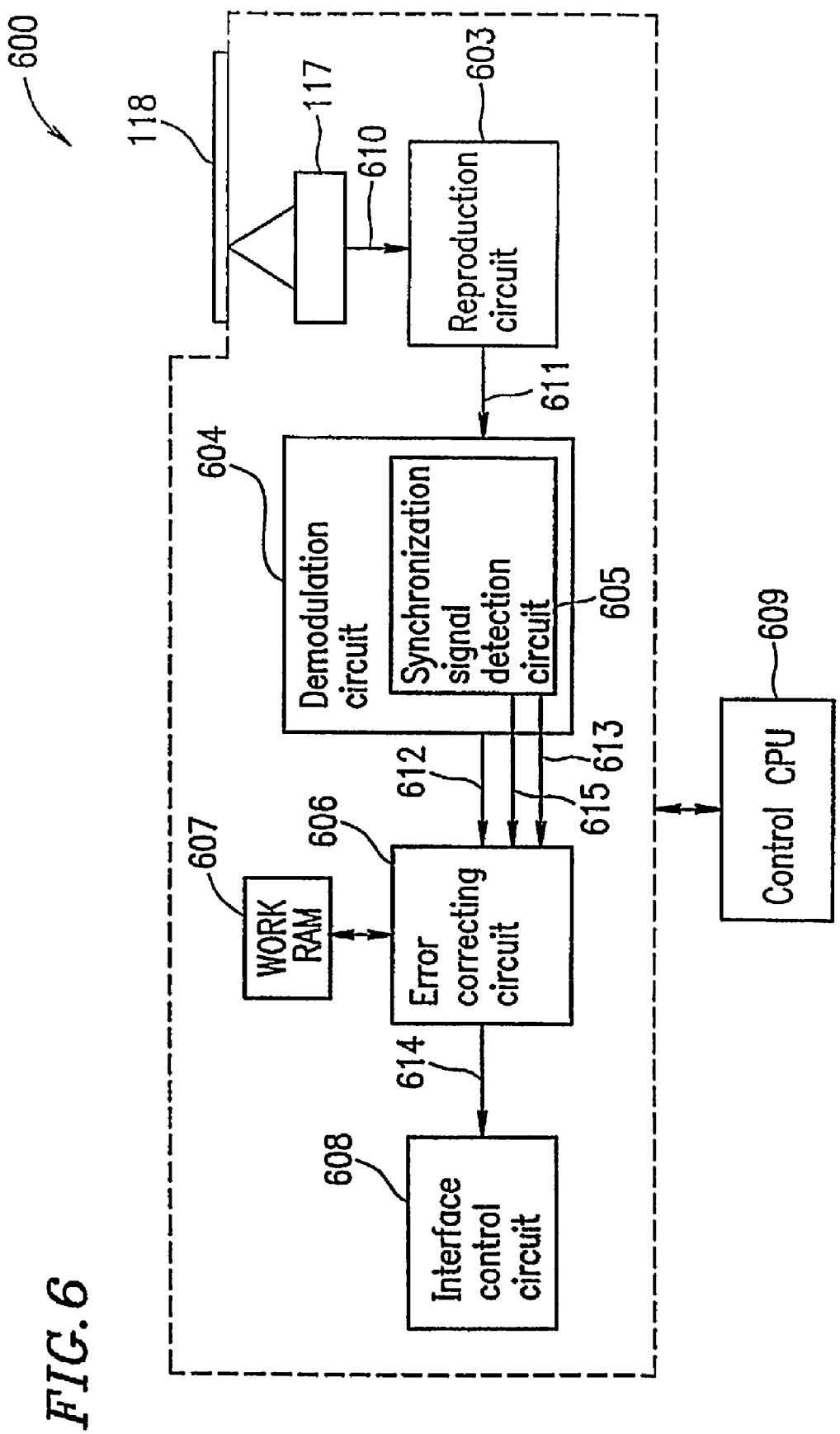
FIG. 6 is a schematic diagram showing a reproduction apparatus according to the present invention.

FIG. 6 is a schematic diagram showing a structure of a reproduction apparatus 600 according to the present invention. The reproduction apparatus 600 reproduces data recorded on the optical disk 118 of the present invention. It is here assumed that the data recorded on the optical disk 115 has the data structure 406 shown in FIG. 4.

The reproduction apparatus 600 comprises a reproduction circuit (reproduction section) 603 for reproducing the data recorded in the optical disk 118 and generating binary data 611, a demodulation circuit (demodulation section) 604 for demodulating binary data 611 to first error correcting codes and second error correcting codes, and an error correcting circuit (error correcting section) 606 for detecting and correcting an error in the first error correcting codes and the second error correcting codes output by the demodulation circuit 604.

The demodulation circuit 604 comprises a synchronization signal detection circuit (synchronization signal detecting section) 605 for generating a result of detecting a synchronization signal.

The error correcting circuit 606 comprises an erasure flag generating circuit (erasure flag generating section) for generating an erasure flag, which is used for erasure correction, to the first error correcting code, based on a result of error correction of the second error correcting code or a result of detection of the synchronization signal, and an erasure correcting circuit (erasure correcting section) for using the erasure flag to perform erasure correction. These circuits will be described below. The error correcting circuit 606 detects and corrects errors on a recording medium due to scratches, dust, or the like, and generates corrected data 614 from which the errors are removed.

The reproduction apparatus 600 may further comprise an optical head 117 for reading data from the optical disk 118, a WORK RAM 607 for use in the operation of the error correcting circuit 606, an interface control circuit 608 for controlling a protocol, such as SCSI or ATAPI, and a control CPU 609. The optical head 117 may comprise a semiconductor laser and an optical element. The interface control circuit 608 performs interface control for transmitting reproduced user data to a personal computer or the like. The control CPU 609 controls the entire reproduction apparatus 600.

In the thus-constructed reproduction apparatus of the present invention, data is reproduced from the optical disk 118 in the following procedure.

Initially, a laser beam is emitted from a semiconductor laser of the optical head 117 to irradiate the optical disk 118. The laser beam is reflected by the optical disk 118, and the reflected light signal 610 is subjected in the reproduction circuit 603 to conversion to an analog signal, amplification, and conversion to binary values, and is transmitted as the binary data 611 to the demodulation circuit 604. The demodulation circuit 604 digitally demodulates a signal modulated in recording (digital modulation signal, such as 8/16 modulation or RLL (1,7)). The digitally demodulated data 612 is transmitted to the error correcting circuit 606 in which errors due to scratches, dust, or the like on a medium are detected and corrected with the help of the WORK RAM 607. Here, the demodulated data 612 contains first error correcting codes and second error correcting codes. In the demodulation circuit 604, the synchronization signal detecting circuit 605 detects a synchronization signal by examining the synchronization signal from the binary data 611 on a bit-by-bit basis, and performs resynchronization in the case when data loses synchronization with clocks due to a bit slip or the like. The synchronization signal detecting circuit 605 predicts the time of detecting a next synchronization signal by counting the number of clocks or the number of bytes from a current synchronization signal, where the current synchronization signal is present upstream of the next synchronization signal along the data stream. When a synchronization signal is detected at a time different from the predicted time and is subjected to synchronization correction, a synchronization correction signal 613 is transmitted to the error correcting circuit 606. When no synchronization signal is detected around the predicted time, a synchronization undetected signal 615 is transmitted to the error correcting circuit 606.

The error correcting circuit 606 decodes the first error correcting codes and the second error correcting codes. When performing error correction to the first error correcting code, a result of error correction of the second error correcting code, the synchronization correction signal 613, and the synchronization undetected signal 615 are used to generate an erasure flag indicating error position information. The erasure flag is used in erasure correction.

The correction process is employed using known Reed-Solomon codes, for example. Error-corrected data 614 is transmitted via the interface control circuit 608 to a host computer or the like (not shown). The overall operations for reproduction are controlled by the control CPU 609.

Figure 7:
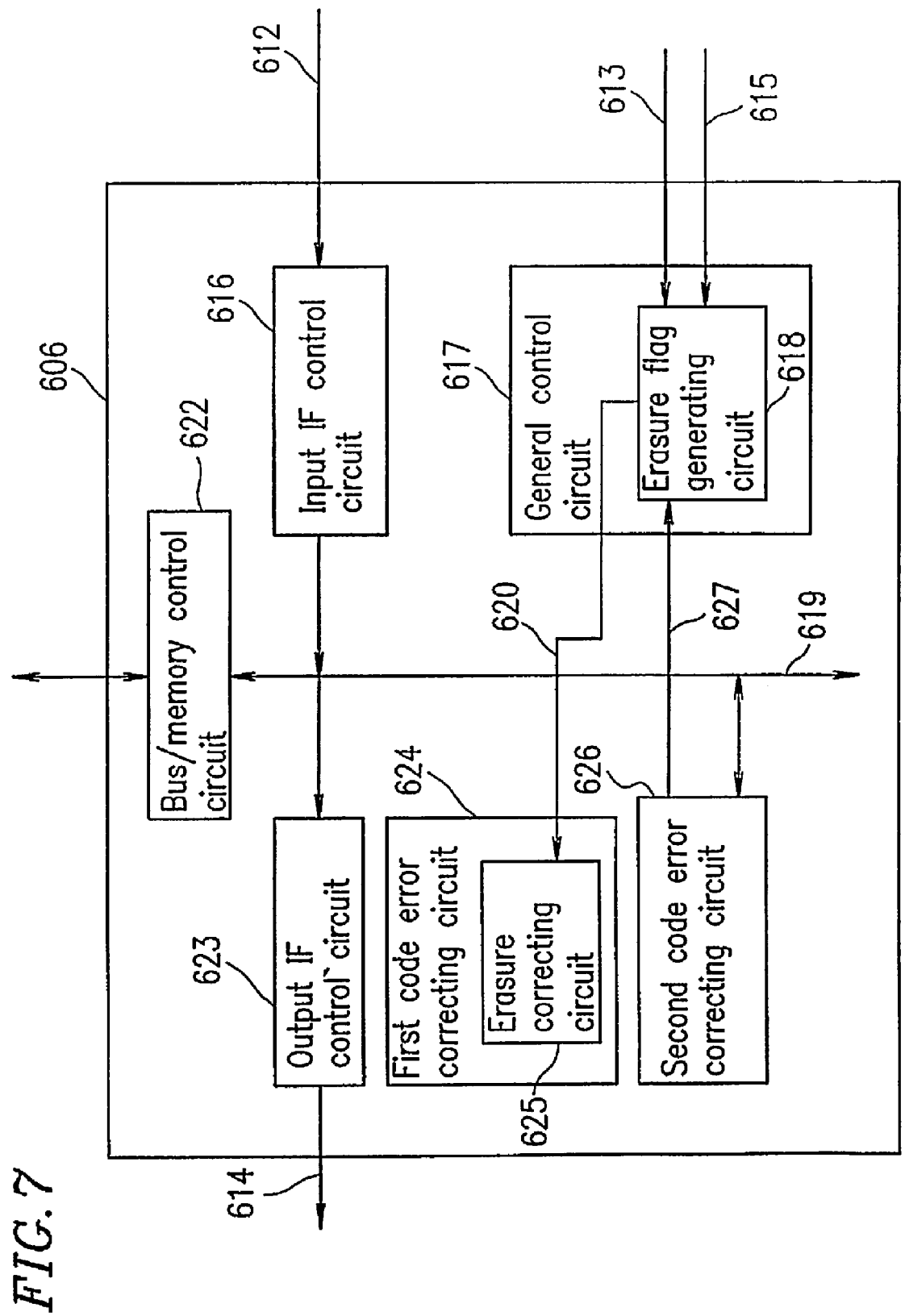
FIG. 7 is a diagram showing in detail an error correcting circuit shown In FIG. 6.

FIG. 7 is a diagram specifically showing a structure of the error correcting circuit 606 shown in FIG. 6.

In FIG. 7, the error correcting circuit 606 comprises an erasure flag generating circuit (erasure flag generating section) 618 for generating an erasure flag for erasure correction of the first error correcting code, based on a result of error correction of the second error correcting code and a result of detection of the synchronization signal, and an erasure correcting circuit (erasure correcting section) 625 for performing error correction using the erasure flag.

The error correcting circuit 606 may further comprise a bus/memory control circuit 622 for controlling recording and reproduction of the WORK RAM 607 and an internal bus 619, an output IF control circuit 623 for outputting the user data 614 after error correction, a first code error correcting circuit 624 for decoding the first error correcting code encoding the user data, and a second code error correcting circuit 626 for decoding the second error correcting code containing encoded control information. The output IF control circuit 623 performs handshaking with the interface control circuit 608. The first code error correcting circuit 624 performs error correction to each column of the first error correcting code containing 216-byte data and an additional 32-byte parity. In error correction, the erasure flag 620 indicating an error position can be used to perform error correction for up to 32 bytes for one code. The erasure correction is performed by the erasure correcting circuit 625. The second code error correcting circuit 626 corrects the second error correcting code containing 30-byte data and an additional 32-byte parity, where error correction can be performed on up to 16 bytes for one code. The above-described first code error correcting circuit 624, second code error correcting circuit 626, and erasure correcting circuit 625 can be constructed with an error correcting circuit employing known Reed-Solomon codes or the like.

The error correcting circuit 606 may further comprise an input IF control circuit 616 for performing IF control with the demodulation circuit 604, and a general control circuit 617 for controlling the entire error correcting circuit 606, which comprises a microcontroller or the like. The demodulated data 612 input to the input IF control circuit 616 is stored via the bus/memory control circuit 622 to the WORK RAM 607. The general control circuit 617 generates the erasure flag 620 based on an error position 627 of the second error correcting code from the second code error correcting circuit 626, the synchronization correction signal 613, and the synchronization undetected signal 615, and transmits it to the erasure correcting circuit 625.

Next, an operation of the thus-constructed error correcting circuit 606 will be described.

The demodulated data 612 reproduced and demodulated from the recording medium is stored to the WORK RAM 607 via the input IF control circuit 616 and the bus/memory control circuit 622. The first error correcting code and the second error correcting code of the stored data are decoded.

For decoding, the second error correcting code is first decoded by the second code error correcting circuit 626. The second code error correcting circuit 626 obtains the error position 627 by the decoding and transmits it to the erasure flag generating circuit 618.

The erasure flag generating circuit 618 generates the erasure flag 620 based on the synchronization correction signal 613 and the synchronization undetected signal 615 input at the same time when the demodulated data 612 is input in advance from the demodulation circuit 604 to the input IF control circuit 616, in accordance with a predetermined rule described below, and transmits the erasure flag 620 to the erasure correcting circuit 625 of the first code error correcting circuit 624.

The first code error correcting circuit 624 and the erasure correcting circuit 625 perform erasure correction to the first error correcting code based on the erasure flag 620.

After completion of error correction, the user data 614 from which errors are removed is transmitted via the output IF control circuit 623 to the interface control circuit 608.

The above-described control of the entire error correcting circuit 606 or the generation of the erasure flag 620 can be executed by the general control circuit 617 and the erasure flag generating circuit 618 which comprise a microcontroller or the like. The execution can also be carried out by software or a simple logic circuit.

Figure 8:
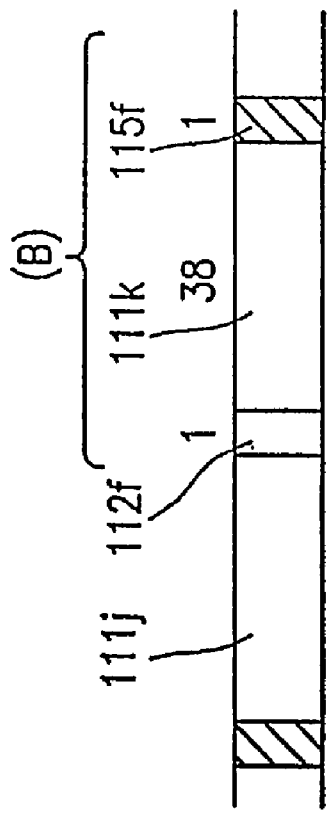
FIG. 8 is a diagram showing an algorithm f or explaining a rule for generating an erasure flag.
Figure 9:
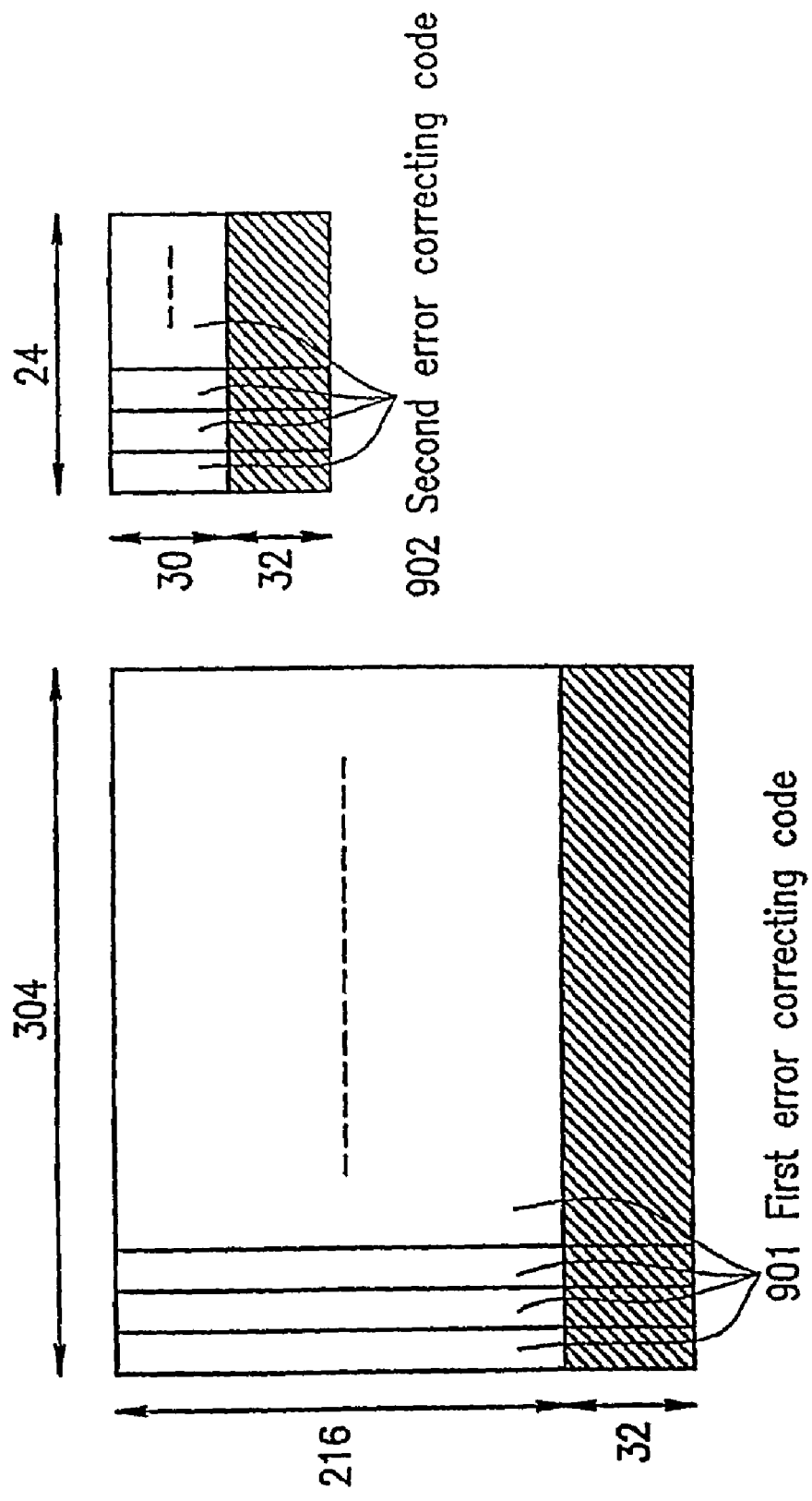
FIG. 9 is a schematic diagram showing a structure of a conventional error correcting code.
Figure 10:
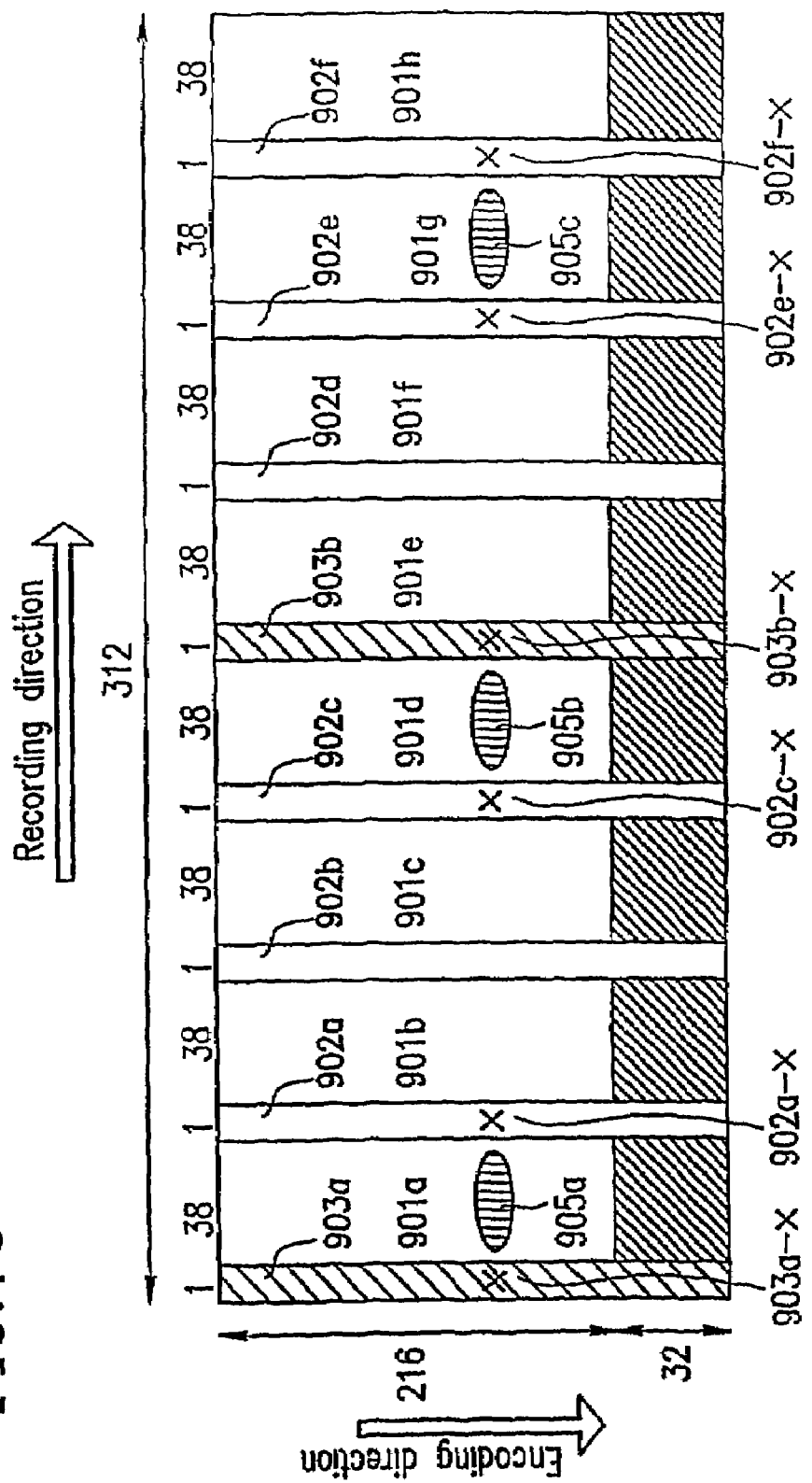
FIG. 10 is a diagram showing a data structure of a conventional data stream in which first error correcting codes and second error correcting codes shown in FIG. 9 are interleaved with synchronization signals in accordance with a predetermined interleaving rule.

FIG. 8 is a diagram showing an algorithm for explaining a rule for generating an erasure flag. In accordance with the generation rule shown in FIG. 8, an erasure flag 420 is generated by software or a simple logic circuit.

In FIG. 8, a reproduced data sequence is categorized depending on a result of detection of a synchronization signal or the presence or absence of an error in the component symbols of a second error correcting code. In FIG. 8, ○ indicates the normal detection of the synchronization signal or the absence of an error in component symbols of the second error correcting code in error correction. X indicates non-detection of the synchronization signal, or the presence of an error in component symbols of the second error correcting code in error correction. Δ indicates that a synchronization signal is detected at a time shifted from the time predicted from the previous synchronization signal upstream in the data stream, and synchronization correction is carried out.

In FIG. 8, 115e and 115f indicate synchronization signals, 111i, 111j and 111k indicate component symbols of first error correcting codes, and 112e and 112f indicates component symbols of second error correcting codes. (A) to the left of FIG. 8 shows a rule for generating an erasure flag to the component symbol 111i of the first error correcting code when the synchronization signal 115e, the component symbol 111i of the first error correcting code, and the component symbol 112e of the second error correcting code are disposed in this order. (B) to the right of FIG. 8 shows a rule for generating an erasure flag to the component symbols 111j and 111k of the first error correcting code when the component symbol 112f of the second error correcting code, the component symbol 111k of the first error correcting code, and the synchronization signal 115f are disposed in this order.

[Case of (A) to the Left of FIG. 8]

(a) When the synchronization signal 115e is normally detected and no error is detected in the component symbol 112e of the second error correcting code, no erasure flag is added to the component symbol 111i of the first error correcting code.

(b) When the synchronization signal 115e is detected at a time shifted from the time predicted from the previous synchronization signal upstream in the data stream and no error is detected in the component symbol 112e of the second error correcting code, no erasure flag is added to the component symbol 111i of the first error correcting code.

(c) When the synchronization signal 115e is not detected and no error is detected in the component symbol 112e of the second error correcting code is detected, no erasure flag is added to the component symbol 111i of the first error correcting code.

(d) When the synchronization signal 115e is normally detected and an error is detected in the component symbol 112e of the second error correcting code, no erasure flag is added to the component symbol 111i of the first error correcting code.

(e) When the synchronization signal 115e is detected at a time shifted from the time predicted from the previous synchronization signal upstream in the data stream and an error is detected in the component symbol 112e of the second error correcting code, no erasure flag is added to the component symbol 111i of the first error correcting code.

(f) When the synchronization signal 115e is not detected and an error is detected in the component symbol 112e of the second error correcting code is detected, it is assumed that a burst error occurs, and an erasure flag 804 is added to the component symbol 111i of the first error correcting code.

[Case of (B) to the Right of FIG. 8]

(g) When no error is detected in the component symbol 112f of the second error correcting code and the synchronization signal 115f is normally detected, no erasure flag is added to the component symbol 111k of the first error correcting code.

(h) When no error is detected in the component symbol 112f of the second error correcting code and the synchronization signal 115f is detected at a time shifted from the time predicted from the previous synchronization signal upstream in the data stream, it is assumed that a burst error occurs due to a bit slip, and an erasure flag 805 is added to the component symbol 111k of the first error correcting code.

(i) When no error is detected in the component symbol 112f of the second error correcting code and the synchronization signal 115f is not detected, no erasure flag is added to the component symbol 111k of the first error correcting code.

(j) When an error is detected in the component symbol 112f of the second error correcting code and the synchronization signal 115f is normally detected, no erasure flag is added to the component symbol 111k of the first error correcting code.

(k) When an error is detected in the component symbol 112f of the second error correcting code and the synchronization signal 115f is detected at a time shifted from the time predicted from the previous synchronization signal upstream in the data stream, it is assumed that a burst error occurs due to a bit slip, and erasure flags 806 and 807 are added to the component symbols 111k and 111j of the first error correcting code.

(l) When an error is detected in the component symbol 112f of the second error correcting code and the synchronization signal 115f is not detected, it is assumed that a burst error occurs, and an erasure flags 808 is added to the component symbol 111k of the first error correcting code.

In accordance with the above-described rules in (A) and (B), erasure flags are generated. The generated erasure flags are used to subject the first error correcting code to erasure correction, thereby making it possible to improve correction capability by a factor of up to 2. For all of the first error correcting codes, erasure flags are generated irrespective of the position of the first error correcting code in the data stream, i.e., how first error correcting codes are interleaved with second error correcting codes and synchronization signals, but only based on a result of detection of the synchronization signal and a result of error detection of the component symbols of the second error correcting code.

As described above, in the reproduction apparatus of the present invention, erasure flags can be generated for all of the first error correcting codes in an equal manner by error detection of the synchronization signal and the component symbols of the second error correcting codes. Therefore, the accuracy of error detection does not vary depending on the position of the first error correcting code in the data stream interleaved with the second error correcting code and the synchronization signals, so that the first error correcting codes can have high reliability throughout the data stream.

INDUSTRIAL APPLICABILITY

As described above, in the data recording method, recording medium and reproduction apparatus of the present invention, a data stream containing first error correcting codes, second error correcting codes and synchronization signals is generated, in which the second error correcting codes and the synchronization signals alternately interleave the first error correcting codes, and the data stream is recorded onto the recording medium by a recording apparatus. Thus, equal error detection of a burst error can be applied to all of the first error correcting codes. Therefore, the reliability does not vary depending on the interleaving manner, so that high reliability of error correction can be guaranteed throughout the data stream. Thus, with the present invention, the data recording method, the optical disk, and the reproduction apparatus each having high reliability can be achieved.

The invention claimed is:

1. A recording medium for storing a data stream containing first error correcting codes obtained by encoding first information, second error correcting codes obtained by encoding second information, and synchronization signals, wherein:
the first error correcting codes have a first correction capability;
the second error correcting codes have a second correction capability higher than the first correction capability;
in the data stream, the second error correcting codes and the synchronization signals alternatively interleave the first error correcting codes; and
the first and second error correcting codes are encoded using Reed-Solomon codes.

2. A reproduction apparatus for reproducing the data stream recorded on a recording medium according to claim 1.

3. A recording apparatus for reproducing the data stream recorded on a recording medium according to claim 1 and for performing a recording based on information contained in the data stream.

* * * * *

UNITED STATES PATENT AND TRADEMARK OFFICE
CERTIFICATE OF CORRECTION

| | | |
|---|---|---|
| PATENT NO. | : 7,284,180 B2 | Page 1 of 1 |
| APPLICATION NO. | : 11/379314 | |
| DATED | : October 16, 2007 | |
| INVENTOR(S) | : Yuji Takagi, Makoto Usui and Hiroyuki Yabuno | |

It is certified that error appears in the above-identified patent and that said Letters Patent is hereby corrected as shown below:

Title Page, Section (63), after "now Pat. No. 7,111,222", insert -- which was filed as application No. PCT/JP02/07232 on Jul. 16, 2002 --.

Title Page, add the following:
 -- (30) Foreign Application Priority Data Jul. 19, 2001 (JP).....2001-220510 --.

Signed and Sealed this

Twenty-ninth Day of July, 2008

JON W. DUDAS
*Director of the United States Patent and Trademark Office*